United States Patent
Taniguchi et al.

(10) Patent No.: US 10,401,444 B2
(45) Date of Patent: Sep. 3, 2019

(54) MAGNETIC RESONANCE IMAGING APPARATUS

(71) Applicant: Hitachi, Ltd., Tokyo (JP)

(72) Inventors: Yo Taniguchi, Tokyo (JP); Toru Shirai, Tokyo (JP); Suguru Yokosawa, Tokyo (JP); Shinji Kurokawa, Tokyo (JP); Hisaaki Ochi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 944 days.

(21) Appl. No.: 14/609,846

(22) Filed: Jan. 30, 2015

(65) Prior Publication Data

US 2015/0276903 A1 Oct. 1, 2015

(30) Foreign Application Priority Data

Mar. 28, 2014 (JP) ................................ 2014-068829

(51) Int. Cl.
| | | |
|---|---|---|
| *G01R 33/54* | (2006.01) | |
| *G01R 33/24* | (2006.01) | |
| *G01R 33/50* | (2006.01) | |
| *G01R 33/561* | (2006.01) | |

(52) U.S. Cl.
CPC ......... *G01R 33/243* (2013.01); *G01R 33/246* (2013.01); *G01R 33/50* (2013.01); *G01R 33/5614* (2013.01)

(58) Field of Classification Search
CPC .... G01R 33/243; G01R 33/246; G01R 33/50; G01R 33/5614; G01R 33/56563; G01R 33/56536
See application file for complete search history.

(56) References Cited

U.S. PATENT DOCUMENTS

| | | | | |
|---|---|---|---|---|
| 7,439,740 | B1* | 10/2008 | Cukur | G01R 33/5613 324/307 |
| 9,476,956 | B2 | 10/2016 | Taniguchi et al. | |
| 2009/0160440 | A1* | 6/2009 | Yui | G01R 33/561 324/307 |
| 2012/0068703 | A1* | 3/2012 | Gross | G01R 33/50 324/309 |
| 2013/0278255 | A1* | 10/2013 | Khalighi | G01R 33/246 324/309 |
| 2015/0015258 | A1* | 1/2015 | Fautz | G01R 33/246 324/309 |

FOREIGN PATENT DOCUMENTS

| | | |
|---|---|---|
| JP | 2011-024926 | 2/2011 |
| WO | 2012/124375 A1 | 9/2012 |

OTHER PUBLICATIONS

English translation of JP 2011-024926 provided by Espacenet. pp. 1-18.*
Japanese Office Action received in corresponding Japanese Application No. 2014-068829 dated Jul. 4, 2017.

\* cited by examiner

*Primary Examiner* — Rishi R Patel
(74) *Attorney, Agent, or Firm* — Mattingly & Malur, PC

(57) ABSTRACT

A quantitative image (resonance frequency map) of a resonance frequency difference is obtained using a high-speed phase compensated pulse sequence of a gradient echo (GE) system. A signal function of the pulse sequence used when obtaining the resonance frequency map is generated by a numerical simulation. The high-speed phase compensated pulse sequence uses a BASG sequence, for example.

17 Claims, 11 Drawing Sheets

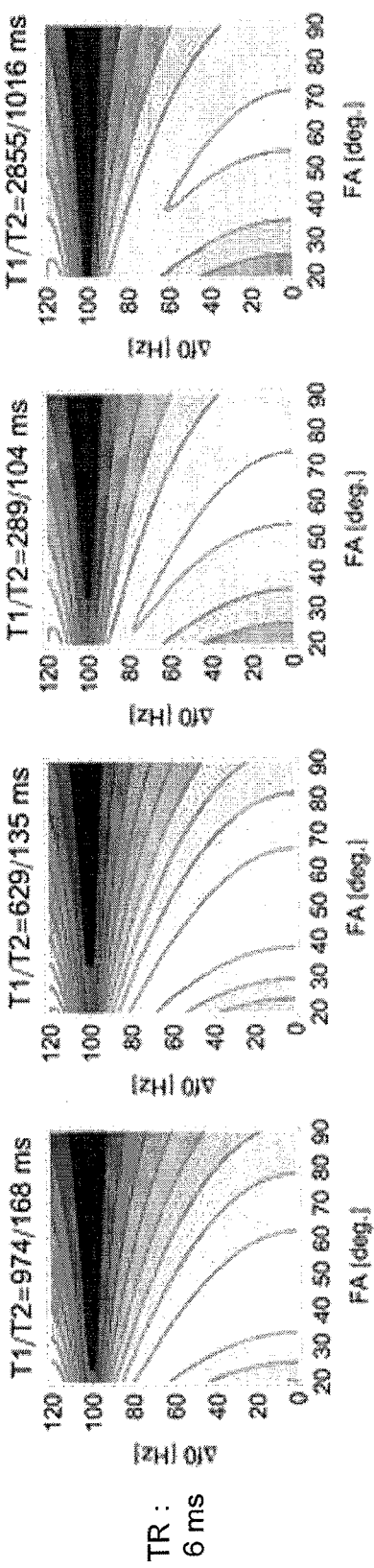
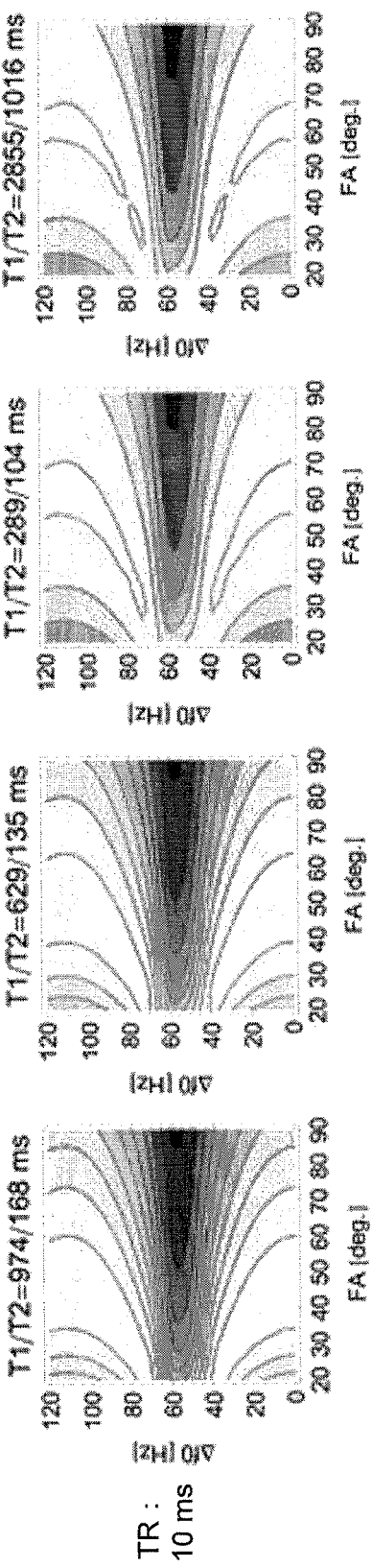

| No. | T1 [ms] | T2 [ms] |
| --- | --- | --- |
| 1 | 895 | 764 |
| 2 | 292 | 275 |
| 3 | 104 | 99 |
| 4 | 72 | 62 |

P1

P2

P3

P4

P5

P6

P7

P8

T1

T2

$f_0$ $B_1$ a

MAGNETIC RESONANCE IMAGING APPARATUS

INCORPORATION BY REFERENCE

The present application claims priority from Japanese patent application JP-2014-068829 filed on Mar. 28, 2014, the content of which is hereby incorporated by reference into this application.

BACKGROUND OF THE INVENTION

1. Field of the Invention

The present invention relates to a magnetic resonance imaging (MRI) technique, and particularly relates to a method for estimating a parameter depending on a subject by computation.

2. Description of Related Art

An MRI apparatus is a medical image diagnostic apparatus that causes nuclear magnetic resonance in hydrogen nuclei in an arbitrary plane that traverses a subject, and captures a tomographic image in the plane from a nuclear magnetic resonance signal (NMR signal; echo signal). Generally, the MRI apparatus applies a slice magnetic field gradient pulse that specifies an imaging plane, and simultaneously applies an excitation pulse that excites magnetization in the plane, to thereby obtain an echo signal generated at a stage where the excited magnetization converges. Here, in order to assign positional information to the magnetization, the MRI apparatus applies a phase encoding magnetic field gradient pulse and a readout magnetic field gradient pulse in directions that are orthogonal to each other in a tomogram plane between the excitation and the obtainment of the echo signal.

The excitation pulse and each magnetic field gradient pulse are applied based on a predetermined pulse sequence. Various pulse sequences are known according to their purposes. For example, there is a gradient echo (GE) pulse sequence for performing high speed imaging, or the like. In the GE pulse sequence, a predetermined pulse sequence is repetitively executed to measure echo signals. One echo signal is measured for one magnetization excitation, and the amplitude of the phase encoding magnetic field gradient pulse is changed for each excitation, so that echo signals necessary for obtaining one tomographic image are measured. Hereinafter, an operation of executing the pulse sequence to obtain an image is referred to as imaging.

In the GE pulse sequence, there is a phase compensated pulse sequence. The phase compensated pulse sequence is obtained by adding a magnetic field gradient pulse for setting a time integration value of a magnetic field gradient on each axis to zero to a normal GE pulse sequence. Thus, a pixel value of an image obtained in the pulse sequence also depends on a resonance frequency. The size of a flip angle of this pulse sequence is generally larger than that of the normal GE pulse sequence, and its phase is alternately reversed. Further, a repetition time TR is relatively short, which is about 5 ms.

As a method for obtaining an image by the MRI technique, there is a method for calculating a desired quantitative value for each pixel using plural images obtained by executing a pulse sequence under different scan parameters. The quantitative value that is an obtainment target includes a value (hereinafter, referred to as a subject parameter) depending on a subject, and a value (hereinafter, referred to as an apparatus parameter) depending on an apparatus.

An image in which the subject parameter or the apparatus parameter is used as a pixel value is referred to as a quantitative image or a map. The quantitative image is calculated using a signal function that determines the relationship between the scan parameter, the subject parameter or the apparatus parameter, and the pixel value. The signal function is analytically obtained and determined for each pulse sequence. Here, according to the imaging schedule, there is a case where the signal function is not easily analytically obtained, or a case where the signal function is analytically obtained but is extremely complicated so that the calculation of the quantitative image is not easy. With respect to such a pulse sequence, there is a technique that calculates a signal function by a numerical simulation to obtain a quantitative image (for example, see JP-A-2011-024926).

SUMMARY OF THE INVENTION

JP-A-2011-024926 discloses a technique that obtains each quantitative image of subject parameters or apparatus parameters including a relaxation time, an irradiation amplitude of a radio frequency magnetic field, a spin density, and a resonance frequency difference with respect to a GE RF-spoiled GRASS (RSSG) sequence that is a high-speed pulse sequence. With respect to the relaxation time, the irradiation amplitude of the radio frequency magnetic field and the proton density among the parameters, a specific example of parameter estimation is disclosed together with the result thereof.

However, JP-A-2011-024926 does not disclose a specific method with respect to the resonance frequency difference. The resonance frequency difference refers to a difference between a resonance frequency and a reference frequency. A quantitative image of the resonance frequency difference, that is, a resonance frequency map, is information having high necessity in that a phase image can be obtained based thereon a magnetic susceptibility map useful for diagnosis can be obtained from the phase image.

As a method of obtaining the quantitative image (resonance frequency map) of the resonance frequency in the RSSG sequence used in JP-A-2011-024926, for example, a method of directly performing computation from plural images obtained by performing imaging while changing an echo time TE may be considered. A phase difference between respective pixels of images obtained at the different echo times TE is proportional to a difference between the echo times TE, and a resonance frequency $f_0$. Thus, if a phase difference is calculated for each pixel using the images captured at two echo times TE, the resonance frequency $f_0$ of each pixel can be estimated. However, if the echo time TE is changed, the influence of a chemical shift in addition to the influence of the resonance frequency $f_0$ is also changed. Thus, for example, in a pixel where different resonance frequency materials such as water and fat are mixed, the phase difference is not proportional to the echo time TE and the resonance frequency $f_0$, which makes it difficult to correctly estimate the resonance frequency $f_0$.

The invention is made in consideration of the above-mentioned problems, and provides a technique that obtains a quantitative image of a resonance frequency difference with high accuracy in a pulse sequence where it is difficult to analytically calculate a signal function or a pulse sequence where an analytically calculated signal function is extremely complicated.

The invention provides a technique that obtains a quantitative image of a resonance frequency difference (resonance frequency map) using a high-speed GE phase compensated pulse sequence. A signal function of the pulse sequence used when obtaining the resonance frequency map is generated by a numerical simulation. As the high-speed phase compensated pulse sequence, a BASG sequence is used, for example.

Specifically, there is provided a magnetic resonance imaging apparatus including: a scan controller that applies a radio frequency magnetic field and a magnetic field gradient to a subject disposed in a static magnetic field according to a predetermined scan parameter and a predetermined pulse sequence to measure an echo signal generated from the subject; an image reconstructor that obtains a reconstructed image from the measured echo signal; and a main controller that controls the scan controller and the image reconstructor, in which the main controller includes a parameter estimator that estimates a map of a subject parameter depending on the subject using a signal function that is determined for each pulse sequence, the signal function is a function that determines the relationship between the scan parameter, the pulse sequence, the subject parameter, and each pixel value of the reconstructed image, the parameter estimator estimates the map of the subject parameter from each reconstructed image obtained by executing the pulse sequence while changing the scan parameter, and the signal function of the pulse sequence, the pulse sequence is a pulse sequence of a gradient echo system where a time integration value of the magnetic field gradient applied between irradiations of two continuous radio frequency magnetic fields becomes zero, and the subject parameter includes a resonance frequency difference which is a difference from a reference frequency.

According to the invention, it is possible to obtain a quantitative image of a resonance frequency difference with high accuracy in a pulse sequence where it is difficult to analytically calculate a signal function.

BRIEF DESCRIPTION OF THE DRAWINGS

FIGS. 5A to 5H are diagrams respectively illustrating signal function examples of an embodiment of the invention.

DESCRIPTION OF EMBODIMENTS

First Embodiment

Figure 1:
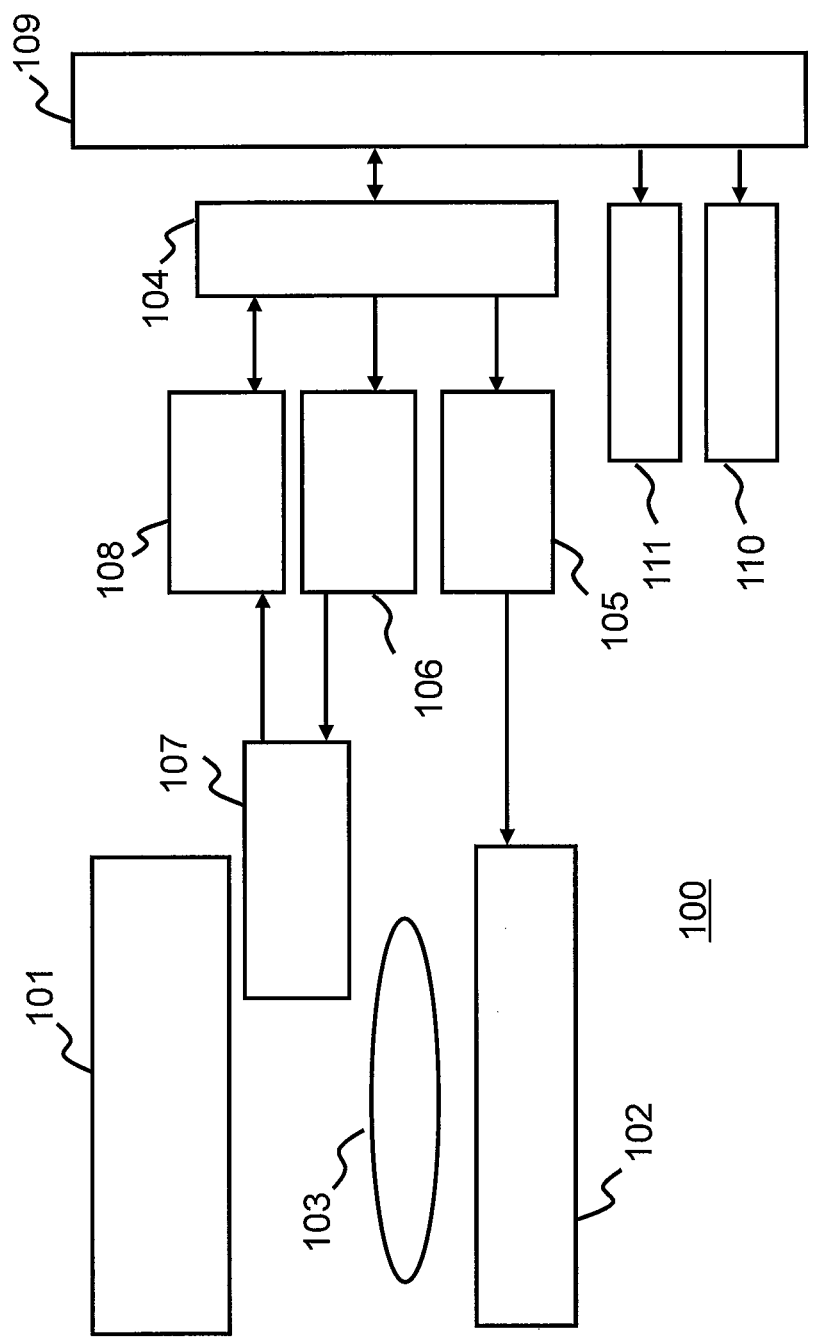
FIG. 1 is a block diagram illustrating a schematic configuration of an MRI apparatus according to an embodiment of the invention.

Hereinafter, a first embodiment to which the invention is applied will be described. Hereinafter, in all the drawings illustrating embodiments of the invention, basically the same reference numerals are given to components having the same functions, and description thereof will not be repeated.

First, an MRI apparatus according to the present embodiment will be described. FIG. 1 is a block diagram illustrating a schematic configuration of an MRI apparatus 100 according to the present embodiment. The MRI apparatus 100 includes a magnet 101 that generates a static magnetic field, a gradient coil 102 that generates a magnetic field gradient, a sequencer 104, a magnetic field gradient power supply 105, a radio frequency magnetic field generator 106, a transmit/receive coil 107 that emits s radio frequency magnetic field and detects a nuclear magnetic resonance signal, a receiver 108, a computer 109, a display 110, and a storage 111. The transmit/receive coil 107 is shown as a single body in the figure, but a transmission coil and a receive coil may be separately provided.

A subject (for example, living body) 103 is placed on a table or the like, and is disposed in a magnetostatic space that is generated by the magnet 101.

The sequencer 104 transmits a command to the magnetic field gradient power supply 105 and the radio frequency magnetic field generator 106 to respectively generate a magnetic field gradient and a radio frequency magnetic field. The radio frequency magnetic field is applied to the subject 103 through the transmit/receive coil 107. A nuclear magnetic resonance signal (NMR signal; echo signal) generated from the subject 103 is received by the transmit/receive coil 107, and is detected by the receiver 108.

A nuclear magnetic resonance frequency (detection reference frequency; resonance frequency $f_0$) that serves as a detection reference is set by the sequencer 104. The detected echo signal is transmitted to the computer 109, and is subjected to signal processing such as image reconstruction by the computer 109. The result is displayed on the display 110. The detected signal or a measurement condition may be stored in the storage 111 as necessary.

The sequencer 104 controls each unit to be generally operated at a timing and an amplitude that are programmed in advance. A program in which a radio frequency magnetic field, a magnetic field gradient, and a signal reception timing or amplitude are stored, among the programs, is referred to as a pulse sequence (pulse sequence).

The computer 109 operates the respective units according to the pulse sequence to measure an echo signal. Further, the computer performs a variety of signal processes with respect to the obtained echo signal to obtain a desired image. The measurement of the echo signal is performed by the sequencer 104.

Figure 2:
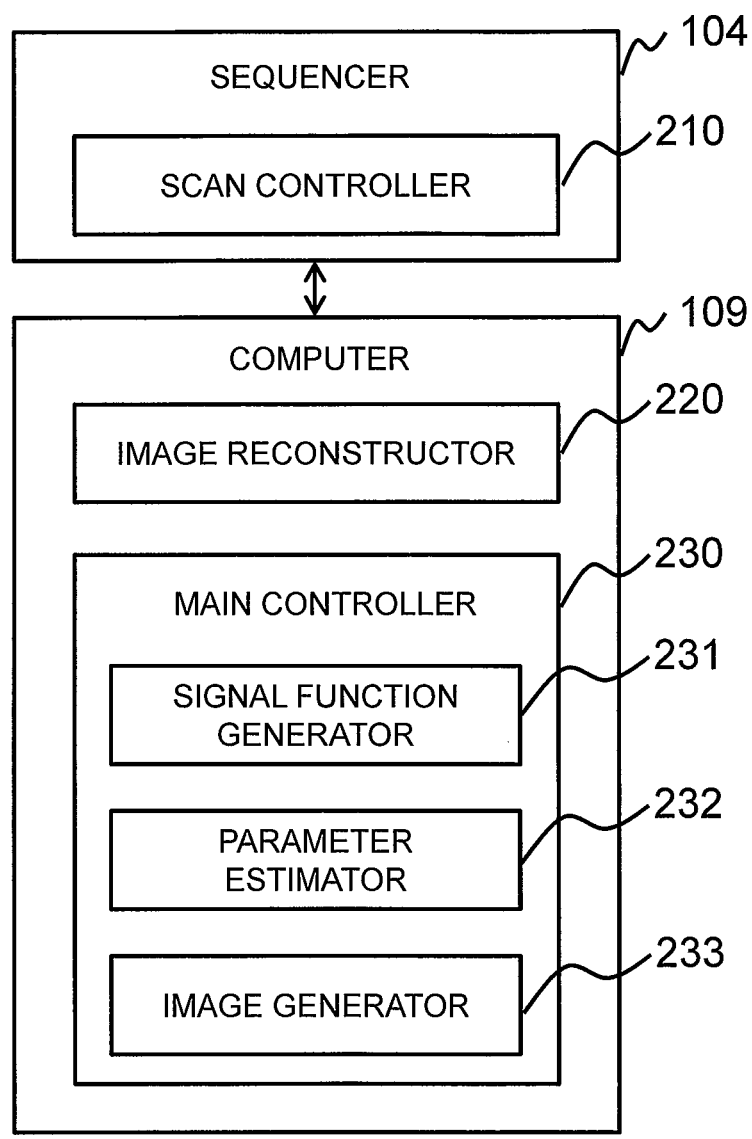
FIG. 2 is a functional block diagram of a computer and a sequencer according to an embodiment of the invention.

In order to realize the variety of processes, as shown in FIG. 2, the computer 109 and the sequencer 104 of the present embodiment include a scan controller (an echo measurement means) 210 that is realized by the sequencer 104 to apply a radio frequency magnetic field and a magnetic field gradient to the subject 103 disposed in the static magnetic field to according to a predetermined pulse sequence and to measure an echo signal generated by the subject 103, an image reconstructor (an image reconstruction means) 220 that is realized by the computer 109 to obtain a reconstructed image from the measured echo signal, and a main controller (a control means) 230 that includes an imaging unit and an image processing unit and controls the entire apparatus.

In the present embodiment, a quantitative value is obtained using a signal function. Further, a desired image is obtained from the obtained quantitative value. The quantitative value is at least one of a parameter depending on a subject and a parameter specific to the apparatus. In the present embodiment, the quantitative value is obtained for each pixel. Accordingly, the obtained quantitative values are referred to as a map.

Hereinafter, in the present embodiment, a parameter capable of being arbitrarily set by a user while a pulse sequence is being executed is referred to as a scan parameter. Further, as the parameters that affect the image quality of the pulse sequence, the parameter depending on the subject is referred to as a subject parameter, and the parameter specific to the MRI apparatus is referred to as an apparatus parameter.

The scan parameter includes a repetition time (TR), an echo time (TE), a radio frequency magnetic field amplitude setting (flip angle (FA)), a radio frequency magnetic field phase (θ), or the like, for example. Further, the subject parameter includes a longitudinal relaxation time (T1), a transverse relaxation time (T2), a spin density (ρ), a resonance frequency difference ($\Delta f_0$), a diffusion coefficient (b), a radio frequency magnetic field irradiation intensity map ($B_1$), or the like. In addition, the apparatus parameter includes a static magnetic field intensity ($B_0$), a receive coil sensitivity map (Sc), or the like. The resonance frequency difference $\Delta f_0$ represents a difference between a resonance frequency and a reference frequency $f_0$ in each pixel.

In order to realize the above-mentioned process, the main controller 230 of the present embodiment controls the scan controller 210 and the image reconstructor 220, and realizes, by a numerical simulation, functions of a signal function generator (a signal function generating means) 231 that generates a signal function for each pulse sequence, a parameter estimator (a parameter estimation means) 232 that estimates a subject parameter for each pixel using the signal function for each pulse sequence to obtain a subject parameter map, and an image generator (an image generating means) 233 that generates a desired image of the subject from the obtained subject parameter map.

The computer 109 includes a CPU and a memory. Further, the respective functions realized by the computer 109 are realized as a program stored in the storage 111 which is loaded to the memory for execution by the CPU of the computer 109. Further, the entirety or a part of the functions may be realized by hardware such as an application specific integrated circuit (ASIC) or the like. In addition, a variety of data used in the process of the respective functions and a variety of data generated during the process are stored in the storage 111.

The signal function generator 231, the parameter estimator 232, and the image generator 233 may be realized by a computer that is provided independently of the MRI apparatus 100 and is capable of performing data transmission and reception with the computer 109 of the MRI apparatus 100.

[Scan Controller]

The scan controller 210 instructs the sequencer 104 to measure an echo signal according to a predetermined pulse sequence. Further, the scan controller 210 arranges the measured echo signal in a k-space.

[Image Reconstructor]

The image reconstructor 220 performs inverse Fourier transform with respect to the echo signal arranged in the k-space by an imaging unit to reconstruct the image.

[Main Controller]

Hereinafter, details about processes of the respective units of the main controller 230 will be described according to a processing flow of the present embodiment.

In the present embodiment, a high-speed phase compensated pulse sequence is used as a predetermined pulse sequence. The phase compensated pulse sequence is designed so that a time integration value of a magnetic field gradient applied between irradiations of two continuous radio frequency magnetic field pulses (RF pulses) becomes zero. Thus, a pixel value of an image obtained by the phase compensated pulse sequence also depends on the subject parameter $\Delta f_0$ as well as the subject parameters T1, T2, ρ, and $B_1$. Accordingly, $\Delta f_0$ is included in the parameters of the signal function. Accordingly, it is possible to obtain a map of $\Delta f_0$ by parameter estimation using such a signal function of the pulse sequence.

[BASG Sequence]

In the present embodiment, a balanced SARGE (BASG) sequence is used as the high-speed phase compensated pulse sequence. First, the BASG sequence will be described. The BASG sequence is a GE pulse sequence, and continuously applies an RF pulse at a short repetition time (TR) to make transverse magnetization into a normal state, thereby obtaining an echo signal.

Figure 3A:
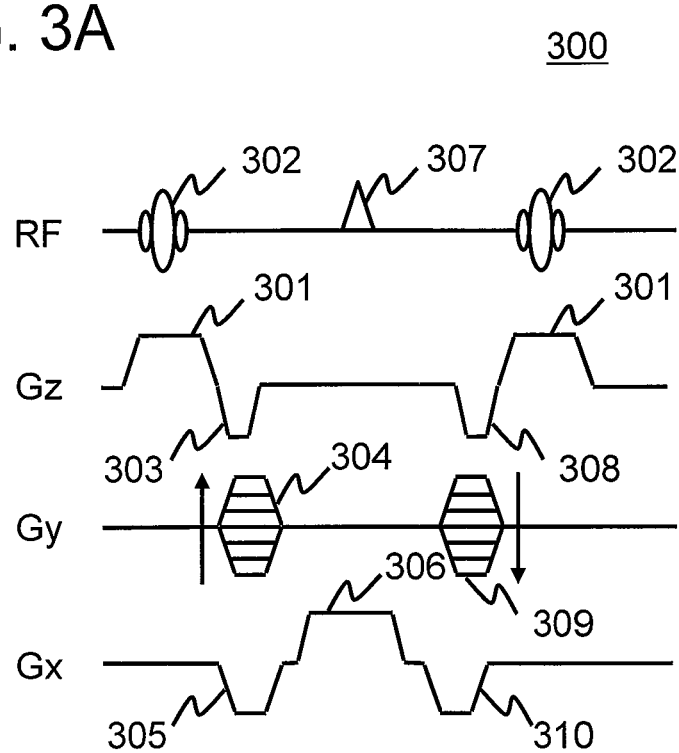
FIG. 3A is a diagram illustrating a BASG sequence according to an embodiment of the invention.

FIG. 3A is a pulse sequence diagram of a BASG sequence 300. In the figure, RF, Gs, Gp, and Gr represent a radio frequency magnetic field, a slice magnetic field gradient, a phase encoding magnetic field gradient, and a readout magnetic field gradient, respectively.

In the BASG sequence 300, first, a slice magnetic field gradient pulse 301 is applied and a radio frequency magnetic field (RF) pulse 302 is irradiated to excite magnetization of a predetermined slice in a target object. Then, a slice rephase magnetic field gradient pulse 303, a phase encoding magnetic field gradient pulse 304 for adding positional information in a phase encoding direction to a magnetization phase, and a readout magnetic field gradient 305 for dephasing are applied, and then, an echo signal 307 are measured with applying a readout magnetic field gradient pulse 306 for adding positional information in a readout direction thereto. Finally, magnetic field gradient pulses 308, 309, and 310 for setting a time integration value of a magnetic field gradient of each axis to zero are applied.

The scan controller 210 repetitively measures the echo signal 307 necessary for obtainment of a single image at the repetition time TR while changing the amplitudes (phase encoding amounts kp) of the phase encoding magnetic field gradients 304 and 309 and changing the phase of the RF pulse 302 by 180 degree.

Figure 3B:
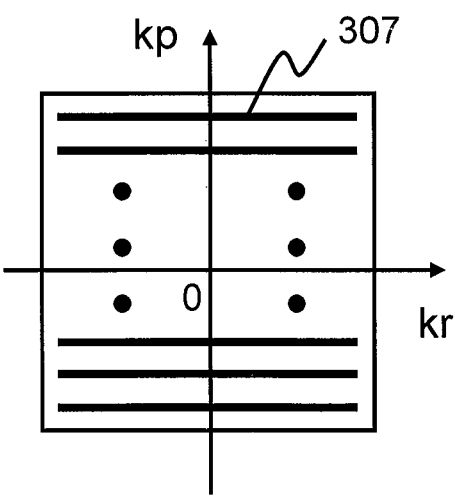
FIG. 3B is a diagram illustrating a k-space arrangement.

The measured echo signals 307 are arranged in the k-space, as shown in FIG. 3B. Further, the image reconstructor 220 performs inverse Fourier transform with respect to the echo signals arranged in the k-space to reconstructs an image. In a GE sequence that includes the BASG sequence, it is generally necessary to set a spin to a normal state so as to measure a stable signal. Accordingly, it is necessary to perform a process called a dummy scan of repeating the sequence without measuring the signal for a time corresponding to about 4×T1 before the signal measurement.

The BASG sequence 300 has a feature in that a T1 emphasized image is obtained. The obtained image represents a T2/T1 reflected contrast, which shows excellent contrast between tissue and blood and is widely used in diagnosis of the shape or function of the heart or diagnosis of the shape of the abdomen.

Figure 4:
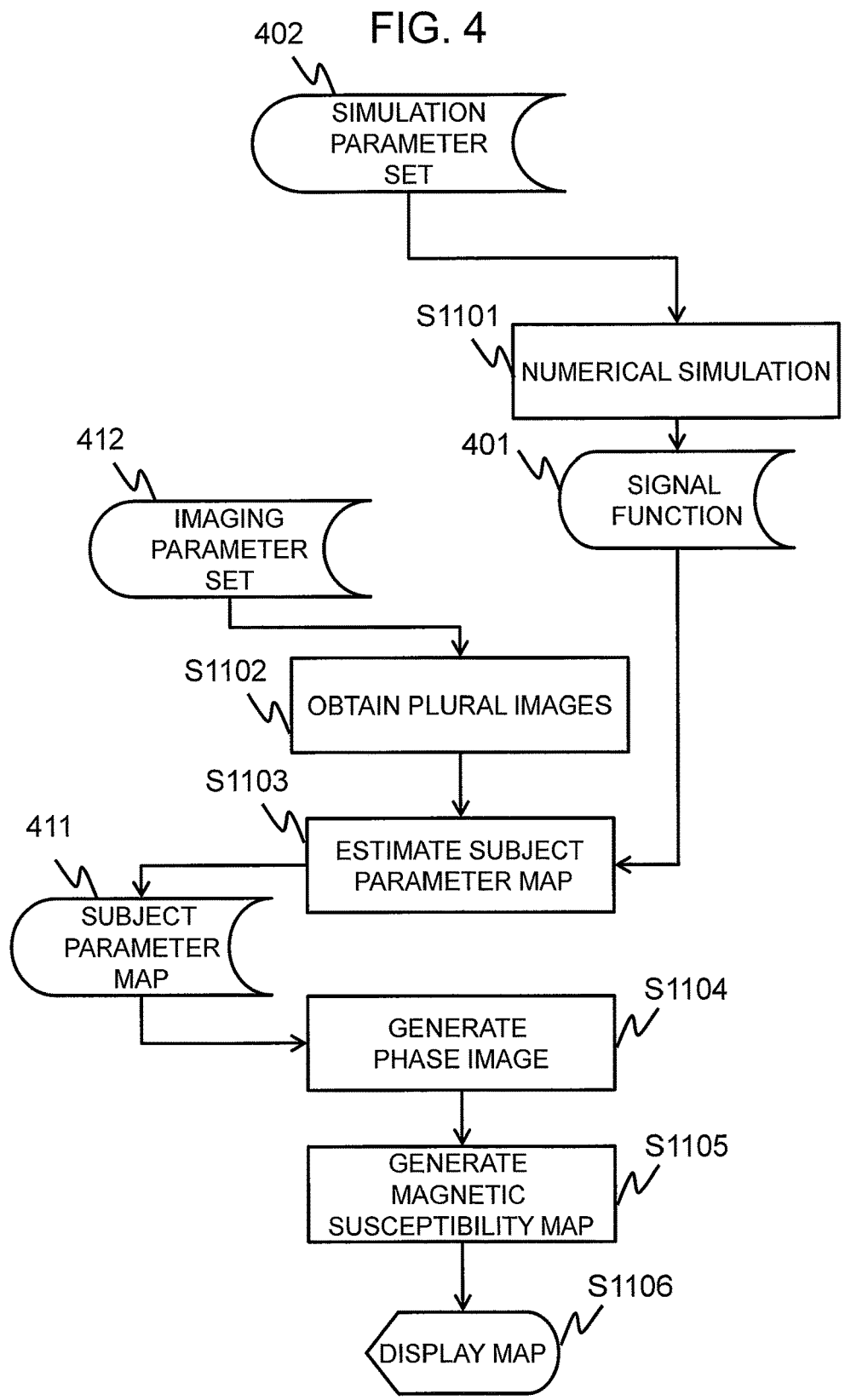
FIG. 4 is a diagram illustrating the flow of a signal function generation process, a parameter estimation process, and an image generation process according to an embodiment of the invention.

Hereinafter, details about the processes of the respective units will be described. FIG. 4 is a diagram illustrating the flow of a signal function generation process in the signal function generator 231, a parameter estimation process in the parameter estimator 232, and an image generation process in the image generator 233 according to the present embodiment.

[Signal Function Generation]

In the present embodiment, the BASG sequence 300 is used as the pulse sequence. The BASG sequence is a pulse sequence in which a signal function is not easily analytically calculated or a pulse sequence in which a signal function is calculated but is extremely complicated. Accordingly, before measurement, the signal function generator 231 performs a numerical simulation (step S1101), and generates a signal function 401. As described above, the signal function refers to the function that determines the relationship between the pulse sequence, the scan parameter, the subject parameter or the apparatus parameter, and each pixel value of the reconstructed image (signal intensity). That is, the signal function is a function for returning the pixel value (signal intensity) using the scan parameter, the subject parameter or the apparatus parameter generated for each pulse sequence as variables.

The signal function generator 231 prepares a plurality of different scan parameters, subject parameters and apparatus parameters, sets all combinations thereof as a simulation parameter set (402), executes the numerical simulation with respect to each combination, and interpolates the obtained results to generate the signal function 401.

Scan parameters capable of being changed in the BASG sequence 300 are FA, TR, and θ. TE among the scan parameters is normally fixed to ½ of TR. Further, in the present embodiment, as the parameters that affect the pixel value of the BASG sequence 300, T1, T2, ρ, $\Delta f_0$, and $B_1$ are used as the subject parameters, and Sc is used as the apparatus parameter. Accordingly, the obtained signal function fs is expressed as the following Formula (1).

$$I = fs(\rho, T1, T2, \Delta f_0, B_1, FA, TR, \theta, Sc) = \rho Sc f(T1, T2, \Delta f_0 + (\theta - \pi)/(2\pi TR), B_1 \times FA, TR) \quad (1)$$

Here, since $B_1$ is a coefficient of FA during imaging, $B_1$ is converted into the form of a product ($B_1 \times FA$) with respect to FA. Further, since the influence of θ on the signal intensity is the same as in a case where $\Delta f_0$ of the subject 103 is changed by $\Delta f_0' = (\theta - \pi)/(2\pi \times TR)$, the size is converted into a sum ($\Delta f_0 + (\theta - \pi)/(2\pi \times TR)$) with respect to $\Delta f_0$. Further, since ρ and Sc act as proportional coefficients with respect to the signal intensity I, ρ and Sc are expressed outside the function. Accordingly, the signal function 401 is expressed by the rightmost formula in Formula (1).

The signal function generator 231 uses Bloch equation in the numerical simulation. That is, the numerical simulation is a simulation that uses a subject model, a pulse sequence, a scan parameter, a subject parameter and an apparatus parameter as an input and solves the Bloch equation which is a fundamental equation of a magnetic resonance phenomenon to output a nuclear magnetic resonance signal (echo signal).

The Bloch equation is a first-order linear ordinary differential equation, and is expressed by the following Formula (2).

$$\frac{d}{dt}\begin{pmatrix}M_x\\M_y\\M_z\end{pmatrix} = \begin{pmatrix}-1/T2 & \gamma H & \\ -\gamma H & -1/T2 & \gamma H_1 \\ & -\gamma H_1 & -1/T1\end{pmatrix}\begin{pmatrix}M_x\\M_y\\M_z\end{pmatrix} + \begin{pmatrix}0\\0\\M_0/T1\end{pmatrix} \quad (2)$$

$$H = B_0 + G_x x + G_y y + G_z z + 2\pi \Delta f_0/\gamma$$

Here, (x, y, z) represents a three-dimensional orthogonal coordinate system, and z corresponds to a direction of a static magnetic field (having the intensity of $B_0$). Further, ($M_x$, $M_y$, $M_z$) represents spins (magnetization vectors in subscript directions), $G_x$, $G_y$, and $G_z$ represent magnetic field gradient amplitudes in the subscript directions, $H_1$ represents a radio frequency magnetic field intensity, $\Delta f_0$ represents a frequency difference of a rotating coordinate system, and $M_0$ represents thermal equilibrium magnetization (spin density). Here, an echo signal is obtained as a vector sum of the transverse magnetization components ($M_x$, $M_y$).

The changing ranges of the scan parameter, the subject parameter, and the apparatus parameter are determined to include a range of a scan parameter used for actual imaging, a value range of a subject parameter assumed in a subject that is an imaging target, and a changeable range of the MRI apparatus 100 used for imaging.

The subject model is given as a single spin (γ, $M_0$, T1, T2). Here, γ represents a gyromagnetic ratio, and $M_0$ represents thermal equilibrium magnetization (spin density). In the BASG sequence 300, time integration values of magnetic field gradients applied between RF irradiations are all zero. Accordingly, a phase difference of spins during RF irradiation becomes zero. Thus, the number of spins of the subject model in the numerical simulation may be set to 1.

The signal function generator 231 sets the intensity of the echo signal at TE obtained by Formula (2) as a signal function value in each given simulation parameter set. Further, by interpolating signal function values obtained with respect to discrete simulation parameter sets, the signal function fs (401) with respect to a continuous simulation parameter set is obtained. A function used for the interpolation is a cubic function, for example. The interpolation may use linear interpolation of about a first order to a third order or spline interpolation.

[Parameter Estimator]

The parameter estimator 232 changes the scan parameter and executes a predetermined pulse sequence to obtain plural images (step S1102), and estimates a desired subject parameter map (411) of the subject 103 from the respectively obtained reconstructed images and the signal function fs (401) of the pulse sequence (step S1103).

The parameter estimator 232 fits the signal value I for each pixel of each image obtained to the signal function fs (401) to obtain (estimate) the desired subject parameter for each pixel. The scan parameter to be changed is created as an imaging parameter set (412) in advance.

Further, in the present embodiment, the subject parameter is estimated using the rightmost formula of Formula (1), that is, the following Formula (3).

$$I = af(T1, T2, \Delta f_0 + (\theta - \pi)/(2\pi TR), B_1 \times FA, TR)$$

$$a = \rho Sc \quad (3)$$

Here, in the present embodiment, maps of all subject parameters used as the variables of the signal function fs (401) are estimated.

[Image Generator]

The image generator 233 uses the estimated map (411) of the subject parameter to obtain a desired image of the subject 103 where the subject parameter is estimated. In the present embodiment, for example, at least one of a phase image and a magnetic susceptibility map is generated using the map of the resonance frequency difference $\Delta f_0$ (steps S1104 and S1105).

Since the resonance frequency difference $\Delta f_0$ and the phase are in a proportional relationship, it is possible to obtain the phase image by multiplying each pixel value by a predetermined coefficient. For example, in order to obtain a phase image in which TE is 40 ms, each pixel value of the $\Delta f_0$ map may be multiplied by 0.04. Further, the phase image is an image in which a magnetic susceptibility difference between tissues is reflected. Accordingly, it is possible to obtain the magnetic susceptibility map by solving an inverse problem based on the phase image.

The image generator 233 adjusts at least a part of the estimated subject parameters or apparatus parameters (411) to a desired value, and applies the result to the signal function fs (401) to obtain a desired type of image.

With such a technique, for example, it is possible to create an image in which $B_1$ is in a uniform state. In this case, $B_1$ is set to 1, and the other subject parameters and apparatus parameters use the estimated values as they are. Further, these values are applied to the signal function fs to calculate each pixel value, thereby obtaining an image.

Further, an image with a different magnetic field intensity $B_0$, or at a different TR or TE may be created. In this case, each parameter is set to a desired value, and the other parameters (for example, T1 and T2) use the estimated values. Further, the signal function fs is calculated using these value to obtain each pixel value. Thus, it is possible to generate an image having an arbitrary contrast.

EXAMPLES

Hereinafter, examples of the present embodiment will be described.

Results obtained by actually estimating T1, T2, $B_1$, and $\Delta f_0$ which are the subject parameters, and a (=$\rho$Sc) which is the apparatus parameter by the above-described method, by the MRI apparatus 100 of 1.5 T, using the BASG sequence 300 are shown.

First, the signal function generator 231 generates a signal function by a numerical simulation. Here, with respect to the following values of T1, T2, and $\Delta f_0$ which are the subject parameters, the scan parameters FA and TR are changed comprehensively as follows to perform the numerical simulation, to thereby obtain the signal value I.

The prepared simulation parameter set 402 is as follows. Specifically, 15 values of T1, 17 values of T2, 13 values of $\Delta f_0$ are prepared as the subject parameters as follows, and 3 values of FA and 4 values of TR are prepared as the scan parameters as follows.

T1 [s]: 15 values are 0.05, 0.07, 0.1, 0.14, 0.19, 0.27, 0.38, 0.53, 0.74, 1.0, 1.5, 2.0, 2.8, 4.0, and 5.6

T2 [s]: 17 values are 0.01, 0.02, 0.03, 0.04, 0.05, 0.07, 0.1, 0.14, 0.19, 0.27, 0.38, 0.53, 0.74, 1.0, 1.4, 2.0, and 2.8

$\Delta f_0$ [Hz]: 13 values are 0, 10, 20, 30, 40, 50, 60, 70, 80, 90, 100, 110, and 120

FA [degree]: 3 values are 40, 50, and 60

TR [ms]: 4 values are 4.4, 5, 6, 7, and 8

As the other parameters, the spin density $\rho$ of imaging target, $B_1$ and Sc are set to be uniform (for example, 1), and $\theta$ is fixed to 180 degree.

The scan parameters are comprehensively changed with respect to the respective subject parameters to perform the numerical simulation, to thereby obtain a total of 39,780 (15×17×13×3×4) images.

The subject model used at this time uses the model in which one spin is arranged as described above.

Further, here, since it is sufficient to calculate the signal intensity of one spin, a pulse sequence in which the phase encoding magnetic field gradient amplitude ($G_y$) of the BASG sequence 300 is zero is used as the pulse sequence. Then, in order to prevent the influence of signal fluctuation, the number of repetition times is set to 100, for example, and the signal value is set to an average value of center values of 100 echo signals. Before computation of the 100 signals, it is necessary to perform a dummy scan for bringing the spin into an approximately normal state. Since the number of repetition times is generally equal to or greater than 4T1 as a sequence execution time, in the case of the above-mentioned parameter set, the longest T1 is 5.6 seconds, the shortest TR is 4.4 ms, and thus, the number of repetition times is 5000.

The signal function generator 231 generates the signal function fs (401) by cubic function interpolation from the signal value obtained by the numerical simulation.

Signal intensities I when changing the scan parameters, the subject parameters, and the apparatus parameters that are variables in the signal function fs (401) created as described above are shown in FIGS. 5A to 5H. Here, with respect to two combinations TRs (6 ms and 10 ms) and four combinations (T1/T2=974/168, 629/135, 289/104, and 2855/1016) of T1 and T2, a transverse axis and a longitudinal axis represent FA and $\Delta f_0$, respectively.

Next, the parameter estimator 232 estimates the subject parameters and the apparatus parameters using the signal function fs (401). Here, a case where the scan parameters are changed to execute the BASG sequence 300 to thereby obtain plural images, using four phantoms in which T1 and T2 are known so that the above parameters are estimated will be described as an example.

Figures 6A, 6B:
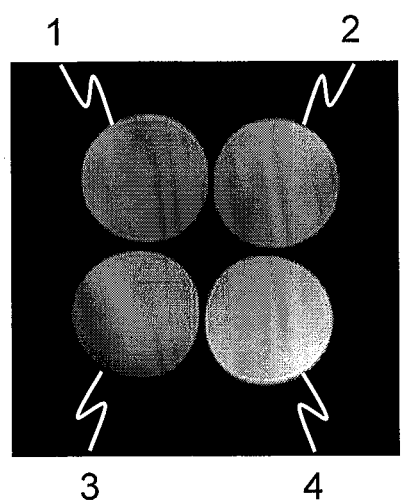
FIG. 6A is a diagram illustrating phantoms of subject parameter estimation targets according to an embodiment of the invention.
FIG. 6B is a table illustrating a relaxation time of each phantom illustrated in FIG. 6A.
Figure 7A:
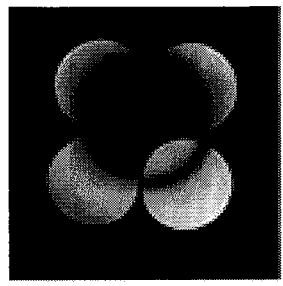
FIGS. 7A to 7H are diagrams illustrating images obtained by performing imaging by a combination of respective scan parameters according to an embodiment of the invention.
Figure 7B:
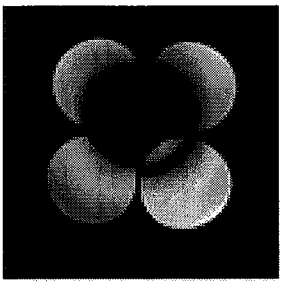
Figure 7C:
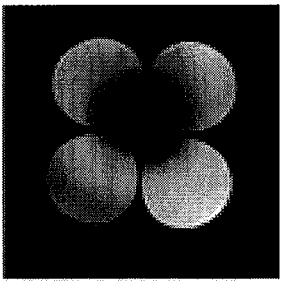
Figure 7D:
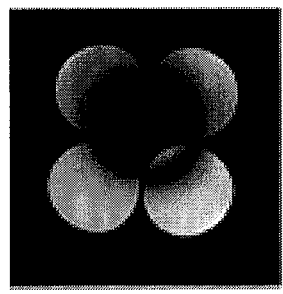
Figure 7E:
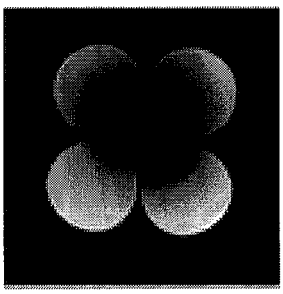
Figure 7F:
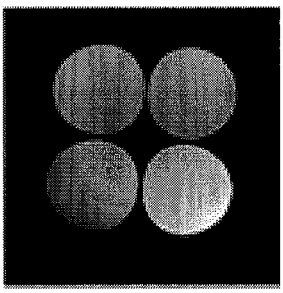
Figure 7G:
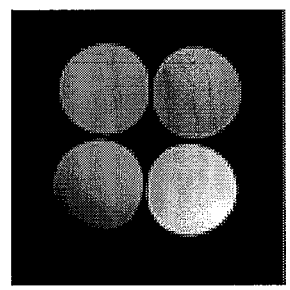
Figure 7H:
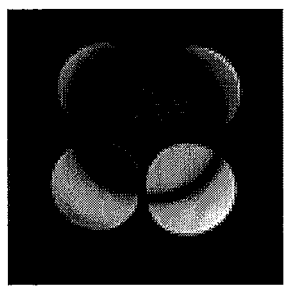

The used four phantoms (Nos. 1 to 4) are shown in FIG. 6A. T1 and T2 of the respective phantoms (Nos. 1 to 4) are shown in FIG. 6B. Phantoms in which aqueous nickel chloride solutions having different concentrations fill cylindrical containers having the same size and different T1 and T2 are realized are used.

The prepared imaging parameter set (412) uses the following eight combinations. Here, FA, TR, and $\Delta f_0' = (\theta - \pi)/(2\pi \times TR)$ are all of the scan parameters in which the variables of the signal function fs (401) are changed.

$$(FA[\text{degree}], \Delta f_0'[\text{Hz}], TR[\text{ms}]) = (40, 70, 8):P1,$$
$$= (40, 80, 8):P2,$$
$$= (40, 90, 8):P3,$$
$$= (40, 100, 6):P4,$$
$$= (60, 120, 5):P5,$$
$$= (60, 10, 4.4):P6,$$
$$= (60, 20, 4.4):P7,$$
$$= (40, 60, 8):P8$$

Eight images (P1 to P8) obtained by performing imaging in the eight combinations of the scan parameters are shown in FIGS. 7A to 7H.

The parameter estimator 232 performs fitting with respect to the signal function fs (function f of Formula (3)) using the images (P1 to P8) to estimate T1, T2, $B_1$, $\Delta f_0$, and a of the respective phantoms (Nos. 1 to 4).

The function fitting is performed by a method such as a least square method expressed by the following Formula (4) or a least square method to examine a relative error expressed by the following Formula (5).

$$\chi^2 = \sum_{FA,\Delta\theta,TR} \{I(FA, \Delta\theta, TR) - \qquad\qquad (4)$$
$$af(T1, T2, \Delta f_0 + (\theta - \pi)/(2\pi TR), B_1 \times FA, TR)\} = \min$$

$$\chi^2 = \sum_{FA,\Delta\theta,TR} \left\{ \frac{I(FA, \Delta\theta, TR) - af(T1, T2, \Delta f_0 + (\theta - \pi)/(2\pi TR), B_1 \times FA, TR)}{I(FA, \Delta\theta, TR)} \right\} = \min \qquad (5)$$

Here, χ represents a total sum of residuals between the signal function and the pixel value of the phantom, and I represents the pixel value in (FA, θ ($\Delta f_0$'), and TR).

Estimation results of the subject parameters T1, T2, $B_1$, and $\Delta f_0$, and the apparatus parameter a, obtained by the above-described processes, are shown in FIGS. 8A to 8E, respectively. Further, comparison results of average values of the estimated values of T1 and T2 and the values of T1 and T2 of the prepared phantoms are shown in FIGS. 9A and 9B, with respect to the respective phantoms (Nos. 1 to 4). In FIGS. 9A and 9B, the left side represents the estimated values, and the right side represents the values of the phantoms.

Figure 8A:
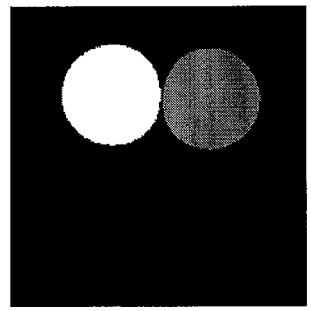
FIGS. 8A to 8E are diagrams illustrating estimation results of respective subject parameters according to an embodiment of the invention.
Figure 8B:
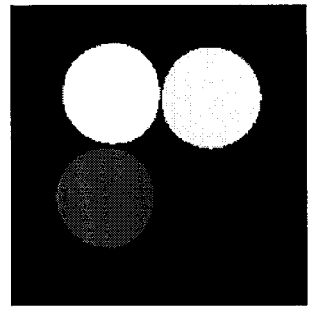
Figure 8C:
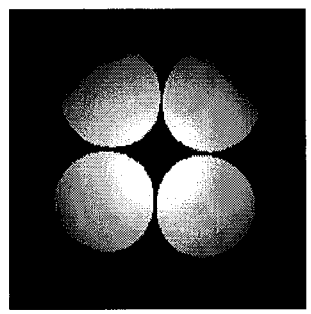
Figure 8D:
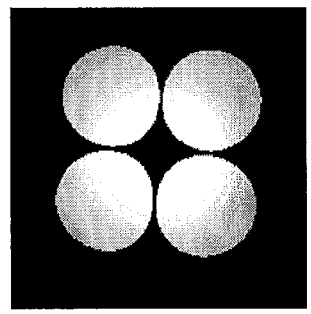
Figure 8E:
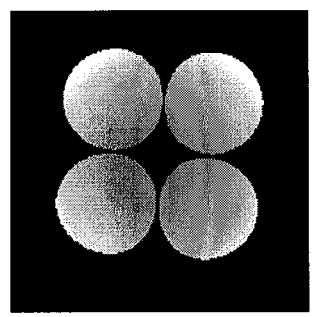
Figure 9A:
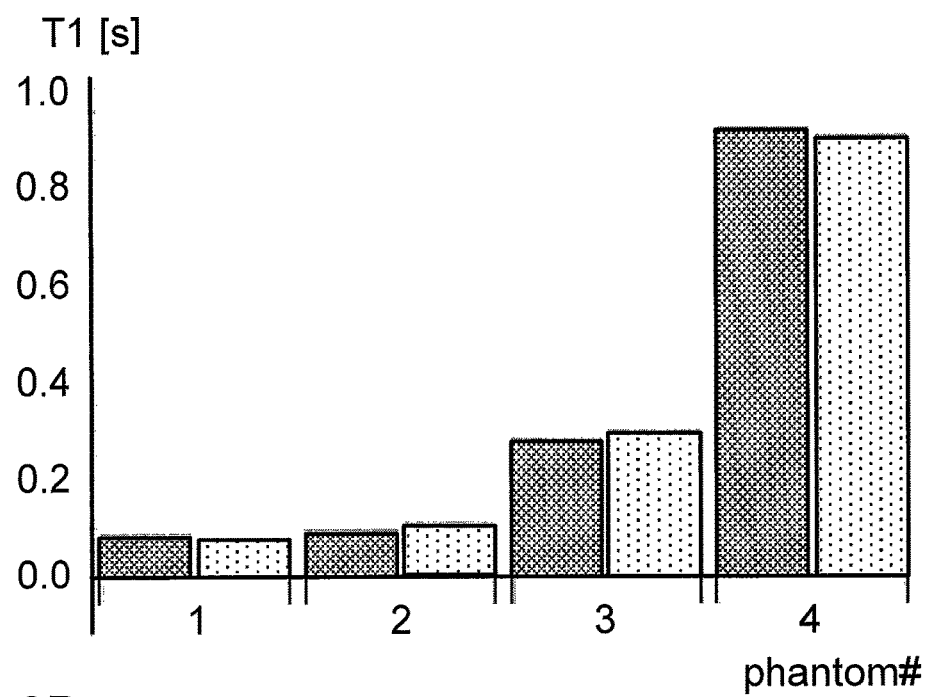
FIGS. 9A to 9B are graphs illustrating estimated values and actual values according to an embodiment of the invention.
Figure 9B:
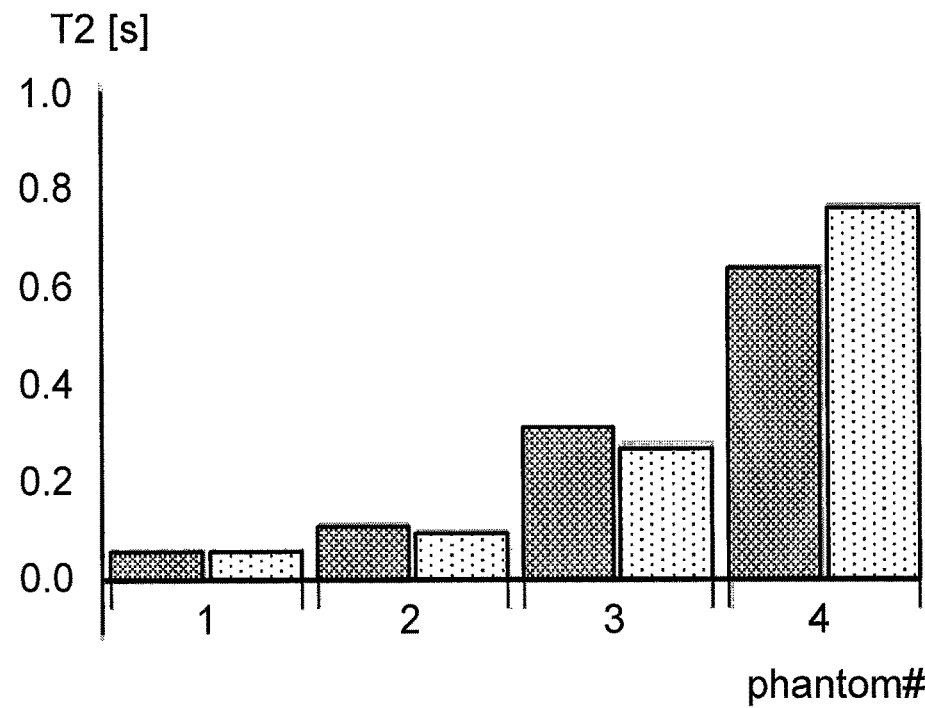

With reference to FIG. 8E, the value of a tends to be reduced at the center of a visual field. This is because the value of a represents the product of the spin density ρ and the receive coil sensitivity Sc, in which the spin densities ρ of the solutions that fill the respective phantoms are approximately the same and the sensitivity Sc of the receive coil tends to be reduced at the center. Further, contrary to the value of a, the value of $B_1$ is the maximum in the vicinity of the center of the visual field, and is reduced around the periphery thereof. This qualitatively matches the feature of the transmission coil. It can be understood from FIGS. 9A and 9B that estimated values that are approximately close to the values of T1 and T2 of the phantoms are obtained as T1 and T2.

As described above, the MRI apparatus 100 of the present embodiment includes the scan controller 210 that applies the radio frequency magnetic field and the magnetic field gradient to the subject 103 disposed in the static magnetic field according to the predetermined scan parameter and the predetermined pulse sequence to measure the echo signal generated from the subject, the image reconstructor 220 that obtains the reconstructed image from the measured echo signal, and the main controller 230 that controls the scan controller 210 and the image reconstructor 220. Here, the main controller 230 includes the parameter estimator 232 that estimates the map of the subject parameters depending on the subject 103 using the signal function determined for each pulse sequence. The signal function is the function that determines the relationship between the scan parameter, the pulse sequence, the subject parameters, and each pixel value of the reconstructed image. The parameter estimator 232 estimates the map of the subject parameters from each reconstructed image obtained by executing the pulse sequence while changing the scan parameter, and the signal function of the pulse sequence. Here, the pulse sequence is the GE pulse sequence where the time integration value of the magnetic field gradient applied between irradiations of the two continuous radio frequency magnetic fields becomes zero, and the subject parameters include the resonance frequency difference that is the difference with the reference frequency.

The main controller 230 may further include the image generator 233 that generates a desired image of the subject from the estimated map of the subject parameters. The main controller 230 may further include the signal function generator that generates the signal function by the numerical simulation. In addition, the parameter estimator may further estimate the map of the apparatus parameters that are the parameters specific to the apparatus, using the signal function.

Further, the subject parameter may include at least one of the longitudinal relaxation time, the transverse relaxation time, the spin density, the diffusion coefficient, and the irradiation intensity map of the radio frequency magnetic field. Further, the apparatus parameters may include at least one of the magnetic field intensity and the sensitivity map of the receive coil. The scan parameters may include the radio frequency magnetic field intensity, the radio frequency magnetic field phase, and the repetition time.

In this way, according to the present embodiment, as the signal function that estimates the subject parameters, the phase compensated pulse sequence and the signal function thereof are used. Since the pulse sequence to be used is the phase compensated type, the pixel values of the obtained image also depend on the resonance frequency difference. Thus, according to the present embodiment, the resonance frequency difference may also be handled as a subject parameter.

Accordingly, according to the present embodiment, it is possible to obtain a quantitative image of the resonance frequency difference (resonance frequency difference map) from the signal function fs, and to obtain a resonance frequency map with high accuracy without the influence of a chemical shift. Further, it is possible to obtain various images useful for diagnosis with high accuracy using the resonance frequency difference map.

Further, according to the present embodiment, it is possible to estimate maps of various subject parameters and apparatus parameters, in addition to the map of the resonance frequency difference. It is possible to obtain an image in a desired condition using the estimation result and the signal function. Particularly, it is possible to obtain an image in an ideal state with respect to a parameter which is not easily adjusted in actual measurement. In addition, by calculating each pixel value using the signal function while changing the scan parameter, it is possible to easily obtain an image with a desired image quality and a desired contrast, to thereby improve diagnosis performance.

Further, in the present embodiment, the signal function is generated using the numerical simulation. Accordingly, even in a pulse sequence where it is difficult to analytically calculate the signal function, it is possible to obtain the signal function.

Modification Example 1

In the above-described embodiment, all of the subject parameters and the apparatus parameters used as the variables of the signal function fs are estimated. However, a part of the parameters may be calculated by a different method, and then, the remaining parameters may be estimated using the above-described method.

That is, the parameter estimating unit 232 may be configured to estimate only parameters incapable of being analytically calculated, among the subject parameters and the apparatus parameters, using the above-described method.

For example, the map of $B_1$ may be calculated by a method called a double angle method (DAM). The DAM method is a method for calculating $B_1$ by the following Formula (6), using luminance values $I_1$ and $I_2$ of images captured at flip angles (FA) a and 2a.

$$B_1 = \text{arc } \cos(I_2/(2I_1))/\alpha \qquad (6)$$

In this case, $B_1$ is calculated by the DAM method, and only the remaining subject parameters and apparatus parameters (for example, T1 and T2, $\Delta f_0$, a) are estimated from the signal function fs.

In this modification example, since the number of estimated parameters can be reduced, even when the SN ratio of an image is low, it is possible to suppress reduction of the estimation accuracy.

Modification Example 2

Further, in the above-described embodiment, the parameter estimator 232 changes all of the scan parameters (FA, TR, and θ) which serve as the variables of the signal function fs when estimating the subject parameters and the apparatus parameters, to thereby obtain plural images. However, the invention is not limited to this method. Plural reconstructed images may be obtained by changing at least one scan parameter.

If TR is changed in the BASG sequence 300, the influence of the chemical shift may occur, similar to RSSG. Thus, when water and fat are mixed in pixels so that the influence cannot be ignored, in the parameter estimation process, the parameter estimator 232 may estimate the subject parameters and the apparatus parameters using the captured image while changing only FA and θ in a state where TR is constant.

With such a configuration, it is possible to estimate $f_0$ without the influence of the chemical shift.

Modification Example 3

The image generator 233 may generate an image (for example, T1 emphasized image and T2 emphasized image) of a pulse sequence that is different from the pulse sequence (BASG sequence 300) used in the parameter estimation, using the estimated subject parameters and apparatus parameters. In this case, the different pulse sequence refers to a pulse sequence in which the signal function fs is known, or an image sequence that has already been created.

Hereinafter, as the different pulse sequence, a case where a spin echo (SE) sequence which is most commonly used as a pulse sequence will be described as an example.

Figure 10A:
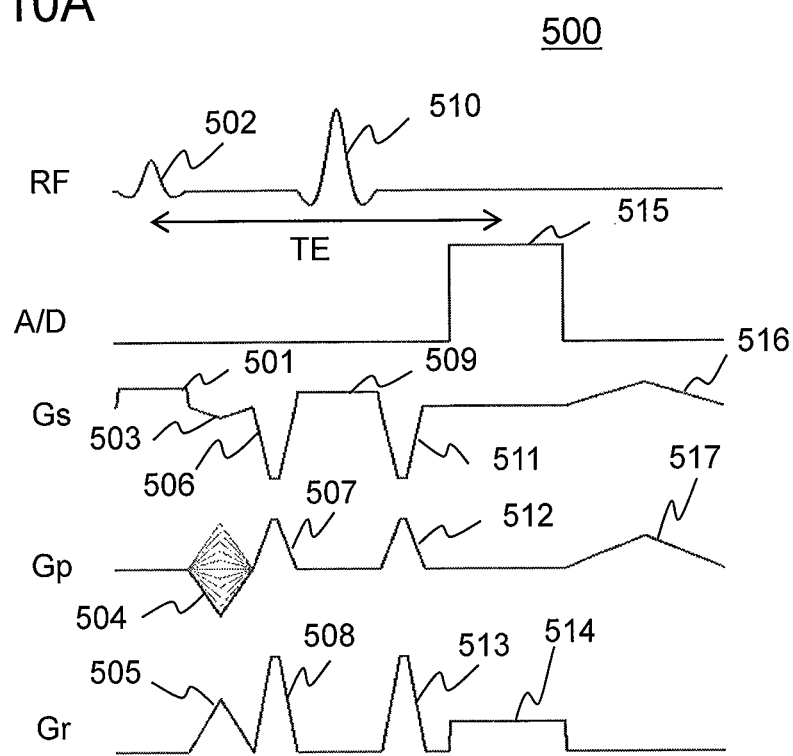
FIG. 10A is a diagram illustrating a spin echo sequence.

First, the SE sequence will be described. FIG. 10A shows an example of an SE sequence 500. In the figure, RF, Gs, Gp, and Gr represent a radio frequency magnetic field, a slice magnetic field gradient, a phase encoding magnetic field gradient, and a readout magnetic field gradient, respectively.

In the SE sequence 500, first, a slice selective magnetic field gradient pulse 501 is applied and a radio frequency magnetic field (RF) pulse 502 is irradiated to excite magnetization of a certain slice in a target body. Then, a slice rephrase magnetic field gradient pulse 503, a phase encoding magnetic field gradient pulse 504 for adding positional information in a phase encoding direction to a magnetization phase, and a readout magnetic field gradient pulse 505 for dephasing are applied. Further, crusher pulses 506, 507, and 508 for suppressing unnecessary signals are applied on respective axes, and then, a slice selective magnetic field gradient pulse 509 and a refocus pulse 510 are irradiated, and crusher pulses 511, 512, and 513 are applied again. Then, an echo signal is measured during an A/D 515 while applying a readout magnetic field gradient pulse 514 for adding positional information in a readout direction, and finally, crusher pulses 516 and 517 are applied. A time from the irradiation of the RF pulse 502 to an echo peak is referred to as an echo time TE.

The above-mentioned procedure is repeated at the repetition time TR while changing the amplitude of the phase encoding magnetic field gradient pulse 504 (phase encoding amount kp) and the slice position to measure echo signals corresponding to the number of necessary slices. The slice position is changed by the frequency of the RF pulse 502.

Figure 10B:
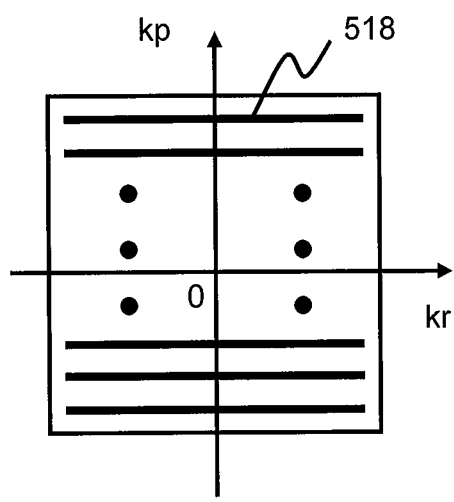
FIG. 10B is a diagram illustrating a k-space arrangement.

Each echo signal 518 is arranged in the k-space for each slice, as shown in FIG. 10B, and are reconstructed as an image by inverse Fourier transform.

In the SE sequence 500, by appropriately changing TR and TE, an image of a T1 emphasized contrast (T1 emphasized image) or an image of a T2 emphasized contrast (T2 emphasized image) is obtained. For example, when TR is set to several hundredths of a milliseconds and TE is set to about ten milliseconds, the T1 emphasized image is obtained, and when TR is set to about several seconds and TE is set to about a hundred milliseconds, the T2 emphasized image is obtained.

A signal function of the SE sequence 500 is analytically calculated, and a luminance value $I_{SE}$ of the image captured in the SE sequence 500 is expressed by the following Formula (7).

$$I_{SE} = a(1 - \exp(-TR/T1))\exp(-TE/T2) \qquad (7)$$

In Formula (7), by using the estimated subject parameters T1 and T2 and by designating the scan parameters TR and TE, it is possible to freely create the T1 emphasized image and the T2 emphasized image with an arbitrary degree of emphasis.

Figure 11A:
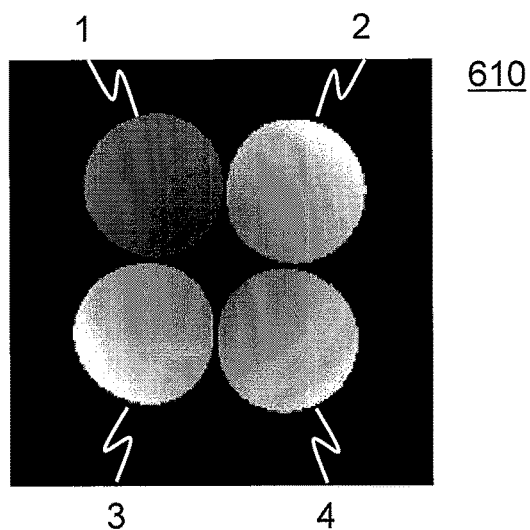
FIGS. 11A to 11C are diagrams respectively illustrating images obtained by three modification examples of the invention.

For example, when the subject parameters T1 and T2 estimated in the example are used and (TR, TE)=(500 ms, 15 ms) is used, a T1 emphasized image 610 shown in FIG. 11A is obtained. In the T1 emphasized image of the SE sequence, as T1 becomes longer, the luminance value decreases. In the image 610 shown in FIG. 11A, similarly, the luminance value of a phantom of No. 1 in which the value of T1 is the largest (longest) is the smallest, and as the value of T1 becomes shorter, the luminance value increases.

Figure 11B:
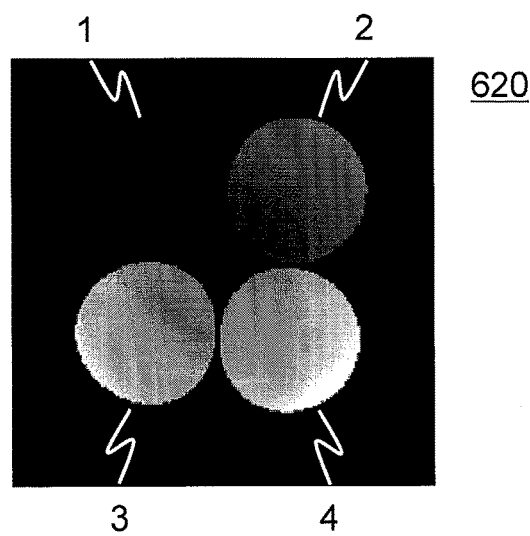

Further, when TR is shortened to (TR, TE)=(100 ms, 15 ms), as shown in FIG. 11B, the contrast is emphasized, and a T1 emphasized image 620 in which the degree of emphasis of T1 is high is obtained. When comparing the image 620 with the image 610, it can be understood that the luminance of the phantom (No. 1) or the phantom (No. 2) in which T1 is long is low in the image 620.

Figure 11C:
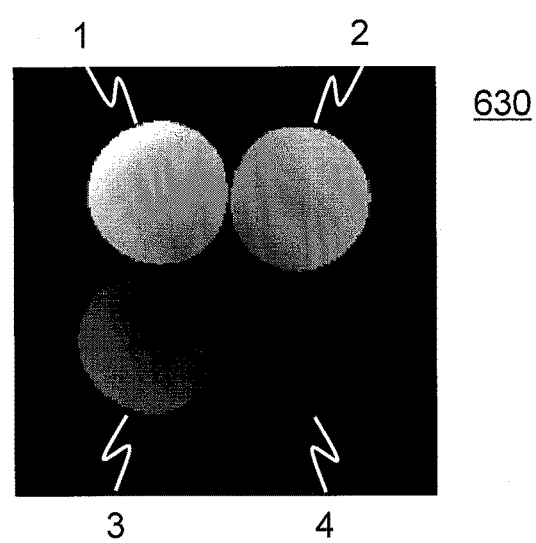

Further, when TR and TE are lengthened, for example, to (TR, TE)=(4000 ms, 100 ms), a T2 emphasized image 630 shown in FIG. 11C is obtained. In the T2 emphasized image, as T2 becomes longer, the luminance value increases. In the image 630 shown in FIG. 11C, similarly, the luminance value of the phantom of No. 1 in which the value of T2 is the largest (longest), and as the value of T2 becomes shorter, the luminance value decreases.

The target pulse sequence is not limited to the SE sequence 500. The target pulse sequence may be a sequence capable of analytically obtaining a signal function as described above, such as a gradient echo sequence or an RSSG sequence, or a sequence capable of being created by a numerical simulation.

According to the present modification example, it is possible to create an image of an arbitrary contrast with an arbitrary pulse sequence using the estimated subject parameters and apparatus parameters.

What is claimed is:

1. A magnetic resonance imaging apparatus comprising:
a scan controller that applies a radio frequency magnetic field and a magnetic field gradient to a subject in a static magnetic field according to a predetermined scan parameter of a plurality of scan parameters and a predetermined pulse sequence of a plurality of pulse sequences to measure an echo signal generated from the subject;
an image reconstructor that obtains a reconstructed image from the measured echo signal; and
a main controller that controls the scan controller and the image reconstructor,
wherein the main controller includes a parameter estimator that estimates a map of a subject parameter depending on the subject using a signal function that is determined for each pulse sequence,
the signal function is a function that determines the relationship between the scan parameter, the pulse sequence, the subject parameter, and each pixel value of the reconstructed image,
the pulse sequence being executed is a pulse sequence of a gradient echo where a time integration value of the magnetic field gradient applied between irradiations of two continuous radio frequency magnetic fields becomes zero,
the subject parameter includes a resonance frequency difference which is a difference between a resonance frequency and a reference frequency in each pixel of the reconstructed image,
the parameter estimator estimates the map of the subject parameter from each reconstructed image obtained by executing the pulse sequence while changing the scan parameter including a phase θ of the radio frequency magnetic field to produce a plurality of reconstructed images, and the signal function of the pulse sequence, wherein the phase θ of the radio frequency magnetic field is converted to a frequency using a repetition time TR and the resonance frequency difference is estimated as the subject parameter,
the parameter estimator estimates resonance frequency difference by converting the phase θ of the radio frequency magnetic field to a frequency according to the following equation: $(\theta - \pi)/(2\pi \times TR)$.

2. The magnetic resonance imaging apparatus according to claim 1,
wherein the main controller further includes an image generator that generates a desired image of the subject from the estimated map of the subject parameter.

3. The magnetic resonance imaging apparatus according to claim 1,
wherein the main controller further includes a signal function generator that generates the signal function by a numerical simulation.

4. The magnetic resonance imaging apparatus according to claim 2,
wherein the image generator generates a phase image from a map of the resonance frequency difference as an image in which a magnetic susceptibility difference between tissues is reflected.

5. The magnetic resonance imaging apparatus according to claim 2,
wherein the subject parameter includes a longitudinal relaxation time and a transverse relaxation time, and
the image generator generates an image of an arbitrary contrast using a map of the longitudinal relaxation time and a map of the transverse relaxation time, which are estimated, and using the signal function of the predetermined pulse sequence.

6. The magnetic resonance imaging apparatus according to claim 5,
wherein the signal function used when the image of the arbitrary contrast is generated is a signal function of a pulse sequence that is different from the pulse sequence in which the map of the subject parameter is estimated.

7. The magnetic resonance imaging apparatus according to claim 3,
wherein the signal function generator executes the numerical simulation with respect to each of combinations of the plurality of scan parameters and a plurality of different subject parameters, and interpolates results obtained from executing the numerical simulation to generate the signal function.

8. The magnetic resonance imaging apparatus according to claim 3,
wherein the signal function generator uses a Bloch equation in the numerical simulation.

9. The magnetic resonance imaging apparatus according to claim 7,
wherein the parameter estimator further estimates a map of an apparatus parameter that is a parameter specific to the apparatus using the signal function.

10. The magnetic resonance imaging apparatus according to claim 9,
wherein the image generator adjusts at least a part of the maps of the subject parameters or the maps of a plurality of apparatus parameters that are estimated, and applies result of the adjustment to the signal function to obtain the desired image.

11. The magnetic resonance imaging apparatus according to claim 1,
wherein the subject parameter further includes at least one of a longitudinal relaxation time, a transverse relaxation time, a spin density, and an irradiation intensity map of the radio frequency magnetic field.

12. The magnetic resonance imaging apparatus according to claim 9,
wherein the apparatus parameter includes at least one of a magnetic field intensity and a sensitivity map of a receive coil.

13. The magnetic resonance imaging apparatus according to claim 1,
wherein the scan parameter includes a radio frequency magnetic field amplitude, a radio frequency magnetic field phase, and a repetition time, and
the parameter estimator changes at least one scan parameter among the scan parameters to obtain the reconstructed image.

14. The magnetic resonance imaging apparatus according to claim 1,
wherein the parameter estimator estimates the map of the subject parameter, with respect to only a subject parameter incapable of being analytically calculated among a plurality of subject parameters.

15. The magnetic resonance imaging apparatus according to claim 14, wherein the subject parameter includes an irradiation intensity map of the radio frequency magnetic field, and the parameter estimator calculates the irradiation intensity map of the radio frequency magnetic field by a double angle method (DAM).

16. The magnetic resonance imaging apparatus according to claim 4, wherein the image generator generates a magnetic susceptibility image from the generated phase image.

17. The magnetic resonance imaging apparatus according to claim 1, wherein the resonance frequency difference ($\Delta f_0$) of the subject parameter is changed by $\Delta f_0'=(\theta-\pi)/(2\pi \times TR)$ as a result of converting the phase $\theta$ of the radio frequency magnetic field to a frequency according to the equation $(\theta-\pi)/(2\pi \times TR)$, to obtain a converted sum of $(\Delta f_0+(\theta-\pi)/(2\pi \times TR))$ with respect to $\Delta f_0$.

* * * * *